(12) United States Patent
Chen et al.

(10) Patent No.: US 10,135,430 B2
(45) Date of Patent: Nov. 20, 2018

(54) ADJUSTING DRIVE STRENGTH FOR DRIVING TRANSISTOR DEVICE

(71) Applicant: Texas Instruments Incorporated, Dallas, TX (US)

(72) Inventors: Suheng Chen, Plano, TX (US); Daniel Andrew Mavencamp, Rockwall, TX (US); Wang Li, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 246 days.

(21) Appl. No.: 15/272,035

(22) Filed: Sep. 21, 2016

(65) Prior Publication Data

US 2017/0207780 A1 Jul. 20, 2017

Related U.S. Application Data

(60) Provisional application No. 62/280,233, filed on Jan. 19, 2016.

(51) Int. Cl.
*H03B 1/00* (2006.01)
*H03K 3/00* (2006.01)
*H03K 5/19* (2006.01)
*H03K 17/687* (2006.01)

(52) U.S. Cl.
CPC ............. *H03K 5/19* (2013.01); *H03K 17/687* (2013.01)

(58) Field of Classification Search
None
See application file for complete search history.

(56) References Cited

U.S. PATENT DOCUMENTS 7,342,447 B2 3/2008 Zhao et al.

*Primary Examiner* — Adam Houston
(74) *Attorney, Agent, or Firm* — Tuenlap D. Chan; Charles A. Brill; Frank D. Cimino

(57) ABSTRACT

A system that can include a detector that can monitor a voltage at an input of a transistor device over a period of time and provide a signal having a value representative of a capacitance between the input and an output of the transistor device. The system can further include a driver that can have a programmable drive strength and be coupled to input of the transistor device to drive the transistor device at the input thereof. The system can further include a controller that can configure the driver based on the signal to drive the transistor device with a corresponding drive strength.

20 Claims, 2 Drawing Sheets

ADJUSTING DRIVE STRENGTH FOR DRIVING TRANSISTOR DEVICE

CROSS-REFERENCE TO RELATED APPLICATION

This application claims the benefit of U.S. Provisional Patent Application No. 62/280,233, filed 19 Jan. 2016 and entitled MECHANISM OF ADJUSTABLE STRENGTH GATE DRIVE, which is incorporated herein by reference in its entirety.

TECHNICAL FIELD

This disclosure relates to adjusting a drive strength for driving a transistor device.

BACKGROUND

Driver circuits are used to regulate current and/or voltage through components or other circuits. In power electronics, driver control switch devices, such as transistors, in switched mode converters, can include an arrangement of switch devices. As an example, metal oxide field effect transistors (MOSFETs or FETs) can be employed as output devices in many applications including amplifiers, power supplies, motor drivers and relays. Thus, a driver circuit needs to be configured with an appropriate strength to drive the gate of the FET at a drive strength at which the FET was designed and fabricated to operate.

SUMMARY

This disclosure relates to adjusting a drive strength for driving a transistor device.

One example relates to a system that can include a detector that can monitor a voltage at an output node that is couplable to an input of a transistor device over a period of time and to provide a signal having a value related to a capacitance between the input and one output of the transistor device. The system can further include a driver couplable to the input of the transistor device via the output node and having a programmable drive strength. The system can further include a controller that can configure the driver based on the signal to drive the transistor device with a corresponding drive strength.

Another example relates to a system that can include a plurality of drivers that each can include a plurality of driver segments coupled to drive an output node, which is couplable to an input of a respective transistor device for driving the respective transistor device. The system can further include a detector that can provide a value based on monitoring a voltage of the output node in response to current provided to the output node for delivery to the input of the respective transistor device over a time interval. The value can be related to a capacitance between the input and an output of the respective transistor device. The system can further include a controller that can selectively enable a portion of the plurality of driver segments of each of the plurality of drivers based on the value to drive each respective transistor device at a corresponding drive strength.

A further example relates to a method that can include monitoring a voltage of an input of at least one transistor device in response to current provided to the input over a time interval and providing a signal based on the monitored voltage of the input. The signal can have a value related to a capacitance between the input and an output of the at least one transistor device. The method can further include setting a drive strength of a driver that is coupled to the input of the at least one driver based on the signal to drive the at least one transistor device with a corresponding drive strength.

DETAILED DESCRIPTION

Systems and methods are described herein to set a drive strength of a driver for driving a transistor device, such as a field effect transistor (FET). The driver can include a number of driver segments that can be selectively enabled or disabled to set the drive strength of the driver. Systems and methods are further disclosed herein that enable setting the drive strength of the driver according to properties (e.g., a capacitance) of the transistor device that is to be driven.

As an example, circuitry can supply a fixed current to a gate of a FET to establish a gate voltage at the gate of the FET. The voltage at the gate of the FET can be monitored over time to provide a monitored gate voltage of the FET. A value can be provided corresponding to a gate-source capacitance of the transistor device based on a relationship between the monitored gate voltage and time. The value can be employed to control a drive strength of a driver for driving the FET. The approach disclosed here can ascertain an appropriate drive strength for the driver to support a wide range of FET devices with various sizes. By establishing the drive strength in this manner affords users the opportunity to optimize cost and performance, further achieving improved efficiency, reliability and EMI characteristics. Although examples disclosed herein are demonstrated with respect to driving one or more FETs, the approach disclosed herein is equally as applicable to set drive strength for driving other transistor device types, such as bipolar junction transistors (BJTs) and junction gate field-effect transistors (JFETs).

Figure 1:
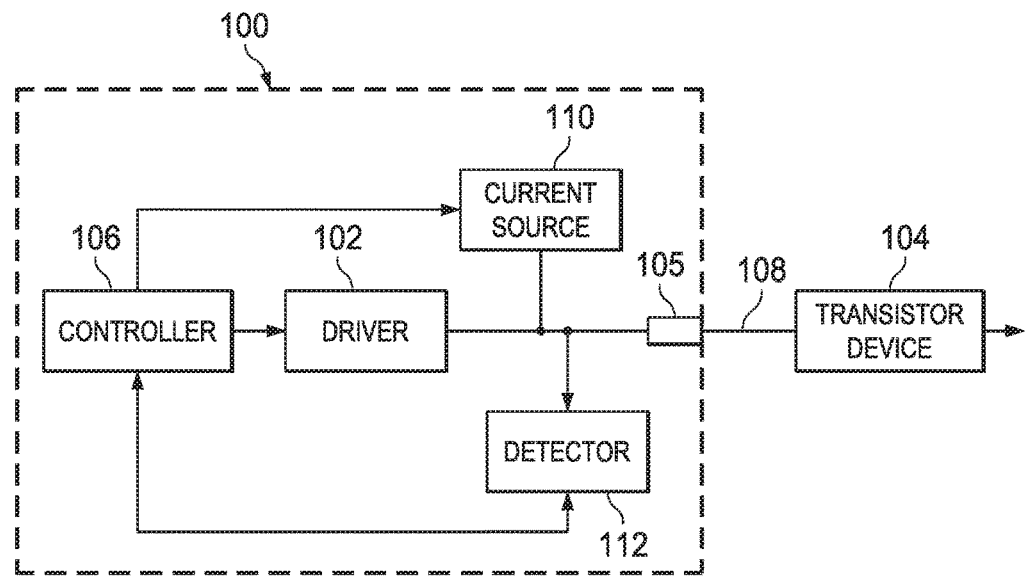
FIG. 1 illustrates an example of a system to adjust a drive strength of a driver for driving a transistor device.

FIG. 1 illustrates an example of a system 100 that can adjust a drive strength of a driver 102 for driving an associated transistor device 104. As used herein, a transistor device 104 can include a number of one or more transistors. In an example, the system 100 can be implemented as one or more integrated circuit (IC) chips that includes an output node 105 that can be coupled to drive an input (e.g., gate) 108 of the transistor device 104. The transistor device 104 thus can be an external transistor device. The driver 102 can have a variable drive strength for driving its output 105. The variable drive strength of the driver 102 can be adjusted via controller 106 of the system 100 to drive an output node 107, which can be coupled to a gate 108 of the transistor device 104 at the corresponding drive strength.

The term "drive strength" as used herein refers to a rate that charge is being provided to the gate 108 of the transistor device 104 over time in response to a current applied at the gate 108 of the transistor device 104 corresponding to a rate that a gate voltage changes over time. An intrinsic capacitance exists between the gate (e. 108 of the transistor device 104 and the source of the transistor device 104 referred to herein as a gate-source capacitance.

The controller 106 can control the driver 102 such that the variable drive strength of the driver 102 can be adjusted to substantially match an appropriate drive strength associated with the transistor device 104. For example, driving the transistor device 104 with a drive strength substantially equal to the appropriate drive strength associated with the transistor device 104 regulates a switching speed of the transistor device 104 such that the transistor device 104 switches within a specified switching time. The appropriate drive strength for driving the transistor device 104 depends on a size of the gate-source capacitance of the FET 104. The system 100 can be configured to program the variable drive strength of the driver 102 to match the appropriate drive strength for the transistor device 104 based on a value related to the gate-source capacitance of the transistor device 104.

In one example, the gate-source capacitance of the transistor device 104 can be determined during a calibration mode. On start-up of the driver 102, the controller 106 can, during the calibration mode, disable the driver 102 to place in the driver 102 in a disabled state, such that a gate driving current of the driver 102 is substantially zero. The controller 106 can transmit a current control signal to activate a current source 110 to supply a current to the output node to which the gate 108 of the transistor device 104 can be coupled. The current source 110 can be configured to provide a substantially fixed current.

By way further of example, if it is assumed that $I_G$ represents the substantially fixed current supplied by the current source 110, Q represents a charge going into the gate 108, $t_A$ represents a start time corresponding to a time that the substantially fixed current is supplied to the gate 108, $t_B$ represents an end time, than the charge Q being supplied to the gate 108 can be represented as $Q=I_G*(t_A-t_B)$. The gate-source capacitance $C_{Gs}$ can be represented as a function of the charge (Q) going into the gate 108 and a gate voltage $V_G$ of the transistor device. For instance, the gate-source capacitance can be calculated according to the following equation $C_{GS}=(I_G*(t_A-t_B))/V_G$. Since $I_G$ is fixed over time (i.e., does not vary), $I_G$ can be ignored to further reduce the equation $C_{GS}=(t_A-t_B))/V_G$. Thus, a mathematical functional relationship between the monitored gate voltage at the gate 108 of the transistor device 104 and time can be related to the gate-source capacitance of the transistor device 108.

The system further comprises a detector 112 that can be coupled to the output node to which the transistor device 104 can be coupled and to the controller 106. The controller 106 can transmit a monitoring activating signal to the detector 112 to cause the detector 112 to monitor the gate voltage over time during the calibration mode. The gate 108 of the transistor device 104 can be supplied with the substantially fixed current and the gate voltage of the transistor device 104 can be monitored over time to provide a value relating to the intrinsic capacitance of the transistor device 104 corresponding to the gate-source capacitance of the transistor device 104. Thus, the mathematical functional relationship between the monitored gate voltage and time can be related to the gate-source capacitance of the transistor device 104.

In one example, the detector 112 monitors the gate voltage of the transistor device 104 over a prescribed time interval to provide the value related to the gate-source capacitance of the transistor device 104. In another example, the detector 112 monitors an amount of time that elapsed for the gate voltage at the gate 108 of the transistor device 104 to reach a threshold in response to supplying the substantially fixed current to provide the value related to the gate-source capacitance of the transistor device 104. The detector 112 can transmit to the controller 106 a detector signal with a value related to the gate-source capacitance of the transistor device 104. The value of the detector signal can be an analog or digital value related to the gate-source capacitance of the transistor device 104.

The controller 106 can adjust the variable drive strength of the driver 102 based on the detector signal. The controller 106 can compare the value of the detector signal to predetermined values of a range or a set of predetermined value ranges corresponding to different drive strengths of the driver 102. The controller 106 thus can program the driver 102 in response to the comparison to set the variable drive strength of the driver 102 based on the value related to gate-source capacitance of the transistor device 104. After the controller calibrates the driver 102, the controller can deactivate the current source 110 and the detector 112 and enter a normal operating mode for the system 100.

The controller 106 thus can program the driver 102 based on the value that is related to the gate-source capacitance of the transistor device 104 so that the driver 102 drives the transistor device 104 at the appropriate drive strength. In another example, the transistor device 104 of FIG. 1 can be replaced with another transistor device having a different gate-source capacitance or a substantially similar gate-source capacitance. The controller 106 can program the driver 102 based on a respective value related to a gate-source capacitance of the other transistor device determined during a calibration mode so that the driver 102 drives the other transistor at an appropriate drive strength. Driving the transistor device 104 at the appropriate drive strength reduces switching losses of the transistor device 104 (and thus improves an efficiency of the transistor device 104), increases a reliability of the transistor device 104 and improves EMI characteristics of the transistor device 104.

Figure 2:
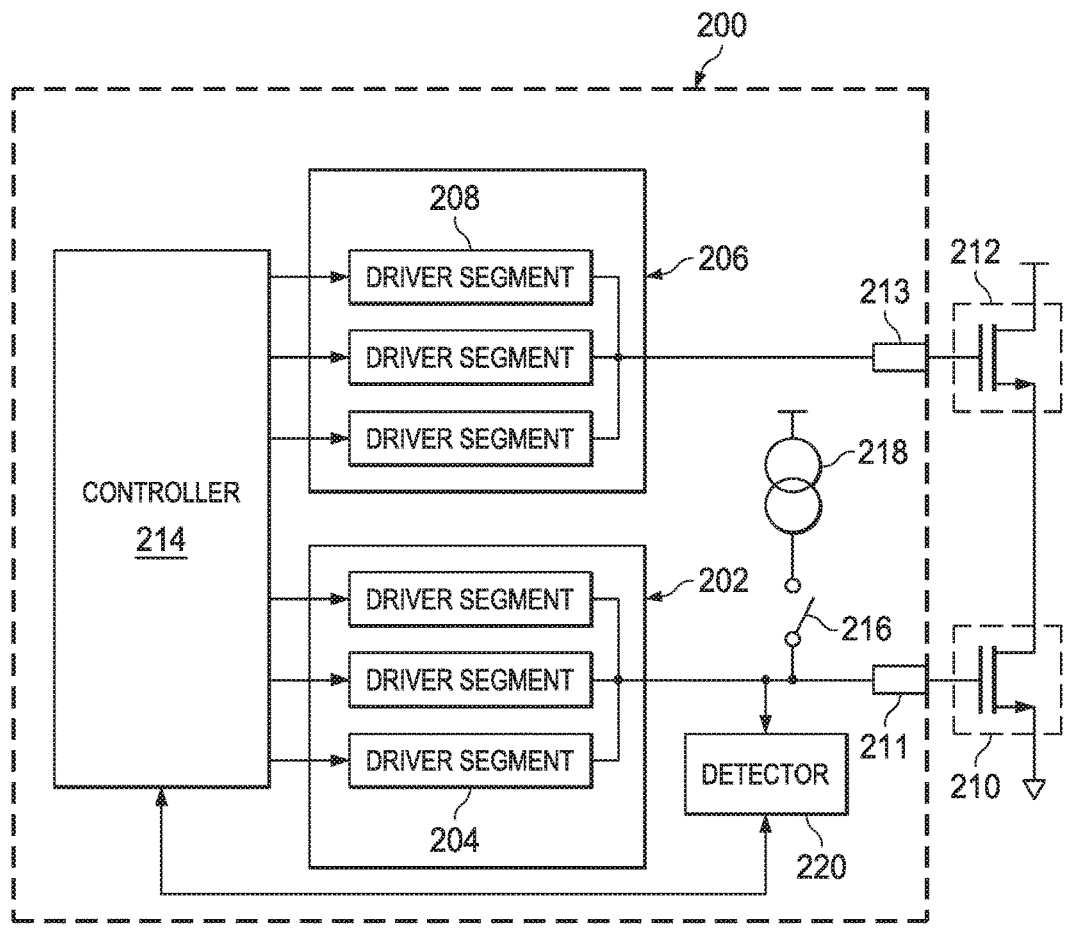
FIG. 2 illustrates an example of another system to adjust a drive strength of a driver for driving a transistor device.

FIG. 2 illustrates an example of another system 200 that can adjust a drive strength of a driver for a transistor device. The system 200 can be employed on one or more integrated circuit (IC) chips. The system 200 can include a first driver 202 that can include one or more driver segments 204 and a second driver 206 that can include one or more driver segments 208. The driver segments of each driver 202 and 206 can be selectively enabled and disabled to adjust a variable drive strength of each driver 202 and 206. Although two drivers 202 and 206 are illustrated in the example of FIG. 2, it is to be understood that the system 200 can include any number of drivers. Each of the drivers 202 and 206 is connected to a respective output node 211 and 213. For example, the first driver 202 can be coupled to a first FET 210 via output node 211 and the second driver 206 can be coupled to a second FET 212 via output node 213. The first and the second FETs 210 and 212 can include respectively one or more FETs. In one example, the system 200 is implemented as an IC, and the first and the second FETs 210 and 212 are external FETs. The first and the second FETs 210 and 212 thus can be coupled to respective output nodes (e.g., terminals) 211 and 213 via respective electrical connections to enable drivers 202 and 206 to drive the FETs.

The system 200 can further include a controller 214. The controller 214 can be coupled to each one of the driver segments 204 of the first driver 202. The controller 214 can further be coupled to each of the one or more driver segments 208 of the second driver 206. The controller 214 can program the one or more driver segments 204 and 208 to adjust the respective variable drive strength of the first and second drivers 202 and 206. Thus, the controller 214 can selectively enable and disable the one or more driver segments 204 and 208 to adjust the respective variable drive strength of the first and second drivers 202 and 206. The controller 214 can program the variable drive strength of each driver 202 and 206 to match an appropriate drive strength associated with the FETs 210 and 212 based on a value related to a gate-source capacitance of the first FET 210.

In one example, the gate-source capacitance of the first FET 210 can be determined on start-up of the first and second drivers 202 and 206. On start-up of the first and second drivers 202 and 206, the controller 214 can calibrate the first and second drivers 202 and 206 during a calibration mode. The controller 214 can transmit a respective disabling signal to each driver 202 and 206 to set the one or more driver segments 204 and 208 of each driver 202 and 206 in a disabled state.

The system 200 can further include a switch 216 coupled between a current source 218 and the output node 211. The switch 216 can be activated in response to a switch activating signal from the controller 214 to close and enable a substantially fixed current to flow from a fixed current source 218 of the system 200 to a gate of the first FET 210 that is coupled to node 211. In another example, the fixed current source 218 can be coupled to the gate of the first FET 210 via node 211, and the controller 214 can supply a current activating signal to the fixed current source 218 to enable the fixed current source 218 to provide the substantially fixed current to gate of the first FET 210.

The system 200 further comprises a detector 220 coupled to the first FET 210 via output node 211 and to the controller 214. The detector 220 can function substantially similar to the detector 112, as illustrated in FIG. 1. The controller 214 can transmit a monitoring activating signal to the detector 220 to cause the detector 220 to monitor the gate voltage of the first FET 210 over time during the calibration mode. Supplying the gate of the first FET 210 with the substantially fixed current and monitoring the gate voltage of the first FET 210 over time can provide an indication of the gate-source capacitance of the first FET 210. The detector 220 can transmit to the controller 214 a detector signal having a value related to the gate-source capacitance of the first FTE 210 corresponding to a mathematical functional relationship between the monitored gate voltage and time.

In one example, the detector 220 monitors the gate-source voltage of the first FET 210 over a prescribed time interval to provide the value related to the gate-source capacitance of the first FET 210. In another example, the detector 220 monitors an amount of time that elapsed for the gate voltage at the gate of the first FET 210 to reach a threshold in response to the substantially fixed current to provide the value related to the gate-source capacitance of the first FET 210.

The controller 214 can receive the detector signal and selectively enable the one or more driver segments 204 and 208 of each driver 202 and 206 to drive the respective FET 210 and 212 at the appropriate drive strength based on the value of the detector signal. The controller 214 can compare the value of the detector signal to predetermined values of a range or a set of predetermined value ranges corresponding to different drive strengths. The controller 214 can control which of the one or more driver segments 204 and 208 of each driver 202 and 206 to enable to drive the FETs 210 and 212 at the appropriate drive strengths based on a result of the comparison. The controller 214 thus can program each driver 202 and 206 based on the gate-source capacitance of the first FET 210.

In an additional example, the controller 214 can store driver segment information characterizing which of the one or more driver segments 204 and 208 of each respective driver 202 and 206 where enabled and disabled in memory of the controller 214 (not shown in FIG. 2). After, the controller 214 can deactivate the current source 218 and the detector 220 and enter a normal operating mode for the system 200.

FIG. 2 illustrates an example where the first and the second FETs 210 and 212 have substantially similar sized gate-source capacitances. In this example, the switch 216, the current source 218 and the detector 206 are configured with respect to the first driver 202 and the controller 214 determines the appropriate drive strength for each driver 202 and 206 based on the gate-source capacitance of the first FET 210. Alternatively, the switch 216, the current source 218 and the detector 206 can be configured with respect to the second driver 202, and the controller 214 can determine the appropriate drive strength for each driver 202 and 206 based on a respective value related to a gate-source capacitance of the second FET 210.

In a further example, the first FET 210 and the second FET 212 can have different gate-source capacitances. The system 200 can be configured with additional circuitry such that the first driver 202 can provide a drive strength that is appropriate for the first FET 210, and the second driver 206 can provide a drive strength that is appropriate for the second FET 212. The system 200 can further include a second switch, a second current source and a second detector. The second switch, second current source and second detector can function substantially similar as the switch 216, the current source 218 and the detector 220, as illustrated in FIG. 2. The switch 216, the current source 218 and the detector 220 can be configured with respect to the first driver 202, and the second switch, the second current source and the second detector can be configured with respect with the second driver 206. Each detector can provide a corresponding detector signal with a value related to a gate-source capacitance of a respective FET 210 and 212. The controller 214 can receive the corresponding detector signals and selectively enable based on the value the one or more driver segments 204 and 208 of each driver 202 and 206 to drive the respective FET 210 and 212 at appropriate corresponding drive strength.

Figure 3:
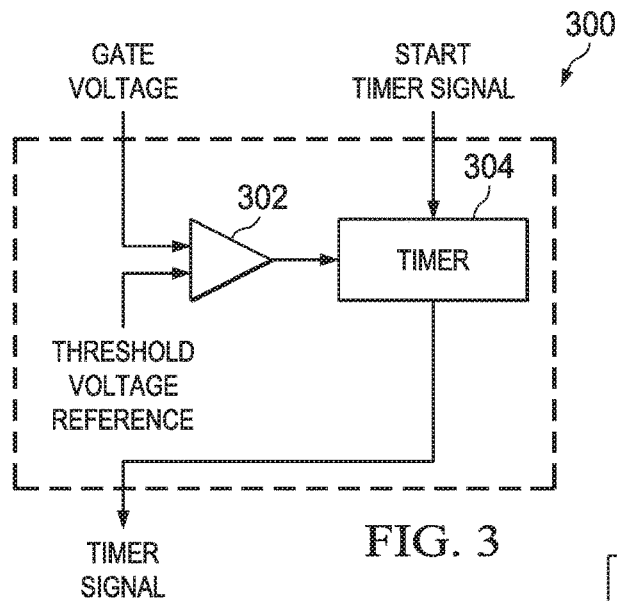
FIG. 3 illustrates an example of a detector.

FIG. 3 illustrates an example of a detector 300 (e.g., DETECTOR 112, as illustrated in FIG. 1 or DETECTOR 220, as illustrated in FIG. 2). The detector 300 can include a comparator 302. The comparator 302 can receive at an input (e.g., at a negative input terminal of the comparator 302) a threshold voltage reference (THRESHOLD VOLTAGE REFERENCE, as illustrated in FIG. 3). The comparator 302 can receive at another input (e.g., at a positive input terminal of the comparator 302) a voltage at a gate of a transistor device (e.g., TRANSISTOR DEVICE 104, as illustrated in FIG. 1 or the first FET 210 or the second FET 212, as illustrated in FIG. 2). The voltage at the gate of the transistor device can correspond to a monitored gate voltage at a given time (GATE VOLTAGE, as illustrated in FIG. 3). The comparator 302 can compare the threshold voltage reference relative to the monitored gate voltage and provide a comparator output signal indicating when the monitored gate voltage is substantially equal or greater than the threshold reference voltage. In one example, the threshold voltage reference can be provided from a controller (e.g., CONTROLLER 106, as illustrated in FIG. 1 or CONTROLLER 214, as illustrated in FIG. 2).

The detector 300 can further include a timer 304 that can measure an amount of time that has elapsed from a start time corresponding to when the timer 304 is activated until the timer receives the comparator output signal from the comparator 302. The timer 304 can be activated in response to a start timer signal (START TIMER SIGNAL, as illustrated in FIG. 3). The start timer signal can correspond to the monitoring activating signal described in context of the examples illustrated in FIGS. 1 and 2. The timer 304 can receive the start timer signal and keep track of an amount of time that has elapsed until receiving the comparator output signal. In an alternative example, the start timer signal can be provided to timer 304 in response to closing of a switch (e.g., switch 216, as illustrated in FIG. 2).

The timer 304 can output a timer signal (TIMER SIGNAL, as illustrated in FIG. 3) in response to the comparator output signal. The timer signal can include timer value corresponding to the amount of time that has elapsed from receiving the start time signal to receiving the comparator output signal at the timer 304. Thus, the timer value can be related to mathematical function relationship between an amount of time that the gate voltage took to reach the threshold voltage reference in response to an applied current at the gate of the transistor device and the gate voltage at the gate of the transistor device. Therefore, the timer value can be related to gate-source capacitance of the transistor device. A timer signal with a greater timer value (e.g., 4 µs) can provide an indication that the transistor device has a larger gate-source capacitance in contrast to a timer signal with a lower timer value (e.g., 2 µs).

The timer signal generated by the timer 304 can be a digital timer signal. The digital timer signal can be supplied from the timer 304 to a controller (e.g., CONTROLLER 106, as illustrated in FIG. 1 or CONTROLLER 214, as illustrated in FIG. 2). The controller can receive the digital timer signal and compare a digital timer value of the digital timer signal to a predetermined range of timer values or to elapsed predetermined timer value ranges associated with different drive strengths. The controller can program an associated driver (e.g., DRIVER 102, as illustrated in FIG. 1 or DRIVERS 202 and 206, as illustrated in FIG. 2) based on the result of the comparison such that a variable drive strength of the driver can be adjusted to substantially match an appropriate drive strength for the transistor device.

Figure 4:
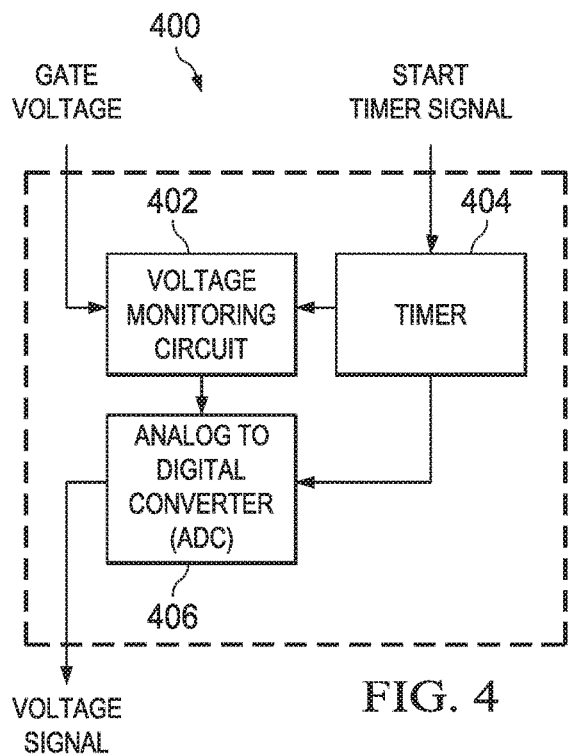
FIG. 4 illustrates an example of another detector.

FIG. 4 illustrates an example of another detector 400. The detector 400 can be configured to function substantially similar to DETECTOR 112, as illustrated in FIG. 1 or DETECTOR 220, as illustrated in FIG. 2. The detector 400 can include a voltage monitoring circuit 402 to monitor a voltage at a gate of a transistor device (e.g., TRANSISTOR DEVICE 104, as illustrated in FIG. 1 or the first FET 210 or the second FET 212, as illustrated in FIG. 2). The voltage monitoring circuit 402 can generate an analog voltage signal in response to a monitoring control signal from a timer 404 of the detector 400. The analog voltage signal can represent the monitored gate voltage of the transistor device at an instant of time. The timer 404 can generate the monitoring control signal after an elapsed amount of time in response to a start time signal (START TIME SIGNAL, as illustrated in FIG. 4). In one example, the start timer signal is provided in response to current flow to the gate of the transistor device, such as in response to closing of a switch (e.g., switch 216, as illustrated in FIG. 2) or a control signal to trigger the flow of current.

The voltage monitoring circuit 402 can in response to receiving the voltage monitoring control signal output an analog monitored gate voltage signal that can include a gate voltage value that can be related (e.g., a mathematical functional relationship) between the gate voltage and at a time that the gate voltage was monitored at the gate of the transistor device. Thus, a change in the monitored gate voltage value over a time period can be related to gate-source capacitance of the transistor device. As an example, an analog monitored gate voltage signal with a greater analog gate voltage value (e.g., 4 microvolts (pV)) can provide an indication that the gate has a larger gate capacitance in contrast to an analog monitored gate voltage signal with a lower analog gate voltage value (e.g., 2 pV). Other voltage ranges (e.g., mV range) could be used in other examples. The detector 400 can further include an analog-to-digital converter (ADC) 406. The ADC 406 can receive the analog monitored gate voltage signal and convert the analog monitored gate voltage signal to a corresponding digital monitored gate voltage signal (VOLTAGE SIGNAL, as illustrated in FIG. 4).

The digital monitored gate voltage signal can be supplied from the ADC 406 to a controller (e.g., CONTROLLER 106, as illustrated in FIG. 1 or CONTROLLER 214, as illustrated in FIG. 2). The controller can receive the digital monitored gate voltage signal and compare a digital gate voltage value relative to predetermined range of digital gate voltage values or to predetermined digital gate voltage value ranges associated with different drive strengths. The controller can configure a (e.g., DRIVER 102, as illustrated in FIG. 1 or DRIVERS 202 and 206, as illustrated in FIG. 2) based on the result of the comparison such that a variable drive strength of the driver can be adjusted to substantially match an appropriate drive strength for the transistor device.

Figure 5:
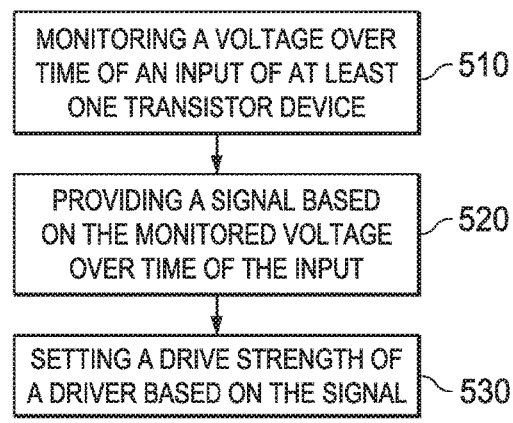
FIG. 5 illustrates an example of a flowchart of a method to control drive strength for driving a transistor device.

FIG. 5 illustrates an example of a flowchart of a method 500 for adjusting a drive strength for a transistor device. At 510, the method 500 can include monitoring a voltage of an input of at least one transistor device (e.g., TRANSISTOR DEVICE 104, as illustrated in FIG. 1 or the first FET 210 or the second FET 212, as illustrated in FIG. 2) in response to current provided to the input over a time interval. At 520, the method 500 can further include providing a signal based on the monitored voltage at the input. The signal can have a value related to an intrinsic capacitance of the at least one transistor device. At 530, the method 500 can further include setting a drive strength of a driver (e.g., DRIVER 102, as illustrated in FIG. 1) to drive the at least one transistor device with a corresponding drive strength based on the signal. The driver can be coupled to the input of the at least one transistor device.

In view of the foregoing, what have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims.

Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A system comprising:
   a detector to monitor a voltage of an output node, which is couplable to input of a transistor device, over a period of time and to provide a signal having a value related to an intrinsic capacitance between the input and one output of the transistor device;

a driver couplable to drive the input of the transistor device via the output node, the driver having a programmable drive strength; and a controller to configure the driver based on the signal to drive the transistor device with a corresponding drive strength.

2. The system of claim 1, wherein the driver comprises a plurality of driver segments, the controller configuring the driver by enabling a discrete number of the plurality of driver segments based on the signal.

3. The system of claim 1, further comprising a current source to provide a fixed current to the output node to establish the voltage at the input of the transistor device.

4. The system of claim 3, wherein, during a calibration mode, the controller disables each of the plurality of driver segments of the driver; and wherein, during the calibration mode, the current source provides the fixed current to the output node and the detector monitors the voltage at the output node, corresponding to input of the transistor device, over time while the plurality of driver segments are disabled.

5. The system of claim 2, wherein the detector further comprises:

a comparator to compare the monitored voltage to a threshold reference voltage and to provide a comparator output signal indicating when the monitored voltage is substantially equal to or greater than the threshold reference voltage; and a timer to provide a timer signal having a timer value related to the intrinsic capacitance between the input and the one output of the transistor device in response to the comparator output signal, wherein the controller programs the corresponding drive strength of the driver based on the timer signal.

6. The system of claim 5, wherein the timer signal is a digital representation of the period of time; and wherein the controller is to selectively enable based on the timer value of the timer signal the discrete number of the plurality of driver segments to drive the transistor device at the corresponding drive strength.

7. The system of claim 6, wherein the controller:

compares the digital representation of the timer value relative to a one or more reference timer values associated with different drive strengths; and determines the discrete number of driver segments to enable such that the driver drives the transistor device at the corresponding drive strength in response to the comparison.

8. The system of claim 2, wherein the detector further comprises:

a timer to generate a monitoring control signal in response to a start timer signal;

a voltage monitoring circuit to provide an analog voltage signal having a voltage value related to the intrinsic capacitance between the input and the output of the transistor device in response to the monitoring control signal; and an analog-to-digital converter to convert the analog monitored voltage signal to a corresponding digital monitored voltage signal, wherein the controller selectively enables the discrete number of the plurality of driver segments of the driver based on a corresponding digital voltage value of the digital monitored voltage signal.

9. The system of claim 8, wherein the controller:

compares the corresponding digital voltage value to one or more digital voltage references associated with different drive strengths; and controls the discrete number of driver segments of the driver to enable based on the comparison such that the driver drives the transistor device at the corresponding drive strength.

10. The system of claim 1, wherein the transistor device comprises one or more field effect transistors.

11. The system of claim 1, wherein the input of the transistor device is a gate of the transistor device; and wherein the one output of the transistor device is a source of the transistor device.

12. An integrated circuit chip comprising the system of claim 1.

13. The system of claim 2, wherein on power-up of the driver, the controller enters a calibration mode and disables each of the plurality of driver segments of the driver; and wherein the controller, during the calibration mode, selectively enables the discrete number of driver segments of the plurality of driver segments of the driver based on the signal for driving the transistor device at the corresponding drive strength during a normal operating mode following the calibration mode.

14. A system comprising:

a plurality of drivers, each of the plurality of drivers comprising a plurality of driver segments coupled to drive an output node, which is couplable to an input of a respective transistor device;

a detector that provides a value based on monitoring a voltage of the output node in response to current provided to the output node for delivery to the input of the respective transistor device over a time interval, wherein the value is related to a capacitance between the input and an output of the respective transistor device; and a controller that selectively enables a portion of the plurality of driver segments of each of the plurality of drivers based on the value to drive each respective transistor device at a corresponding drive strength.

15. The system of claim 14, further comprising a current source coupled to supply a fixed current to the output node for delivery to input of the at least one transistor device during a measurement interval of a calibration mode, wherein the controller sets the plurality of driver segments of each driver in a disabled state during the measurement interval of the calibration mode.

16. The system of claim 14, wherein the detector is to monitor a respective voltage at the output node being supplied to the input of each transistor device and to provide a respective value related to the capacitance between an input and a respective output of each respective transistor device; and wherein the controller is to selectively enable based on the respective value a portion of the plurality of driver segments of each driver to drive the respective transistor device at a given drive strength.

17. The system of claim 15, wherein the respective the transistor device comprises one or more field effect transistors.

18. The system of claim 15, wherein the detector provides to the controller a signal comprising one of a timer value and a voltage value related to the capacitance between the input and the output of the respective transistor device; and wherein the controller configures each of the drivers to set the corresponding drive strength in response to the signal.

19. A method comprising:

monitoring a voltage of an input of at least one transistor device in response to current provided to the input over a time interval;

providing a signal based on the monitored voltage of the input, the signal having a value related to a capacitance between the input and an output of the at least one transistor device; and setting a drive strength of a driver that is coupled to the input of the at least one driver based on the signal to drive the at least one transistor device with a corresponding drive strength.

20. The method of claim 19, wherein the driver includes a plurality of driver segments; and wherein setting the drive strength further comprises enabling a number of the plurality of driver segments of the driver based on the signal to set the corresponding drive strength for the at least one transistor device.

* * * * *